United States Patent [19]

Hayashi

[11] Patent Number: 4,544,884
[45] Date of Patent: Oct. 1, 1985

[54] PERIOD AND FREQUENCY MEASURING INSTRUMENT

[75] Inventor: Mishio Hayashi, Saitama, Japan

[73] Assignee: Takeda Riken Co., Ltd., Tokyo, Japan

[21] Appl. No.: 531,711

[22] Filed: Sep. 13, 1983

[30] Foreign Application Priority Data

Sep. 13, 1982 [JP] Japan .................. 57-159187

[51] Int. Cl.$^4$ .......................................... G01R 23/02
[52] U.S. Cl. ............................... 324/78 R; 324/78 D; 324/79 D; 377/52
[58] Field of Search ............... 324/78 R, 78 D, 79 R, 324/79 D, 78 E, 78 Z; 377/39, 52; 328/140, 141; 364/484

[56] References Cited

U.S. PATENT DOCUMENTS

| 4,150,432 | 4/1979 | Sorden | 324/78 D |
| 4,216,463 | 8/1980 | Backof | 324/78 D |
| 4,257,003 | 3/1981 | Yool | 324/78 D |
| 4,301,405 | 11/1981 | Carlson | 324/78 D |
| 4,310,800 | 1/1982 | Baker | 324/78 D |
| 4,330,746 | 5/1982 | Stulting | 324/79 D |
| 4,350,950 | 9/1982 | Waldmann | 324/78 D |
| 4,456,876 | 6/1984 | Haymaker | 377/52 |

Primary Examiner—Michael J. Tokar
Attorney, Agent, or Firm—Staas & Halsey

[57] ABSTRACT

A device for determining with high accuracy the period and frequency of an input signal by taking into account the fractions of a clock signal that are normally ignored. A gate signal with an integral number of clock pulses is generated. Each fractional time is accurately measured by first and second integrators, and an up-down counter provides the difference between the fractional times for the final determination.

6 Claims, 4 Drawing Figures

PERIOD AND FREQUENCY MEASURING INSTRUMENT

BACKGROUND OF THE INVENTION

This invention relates to a period and frequency measuring instrument which measures period and frequency of a relatively low frequency input signal with high accuracy.

In measuring frequency or period of an input signal of relatively low frequency by a period and frequency measuring instrument, the input signal is used as a gate signal for gating internal clock signals to a counter which counts the number of clock pulses to determine the period and thus the frequency of the input signal.

FIG. 1 shows one of the conventional period and frequency measuring instruments of this kind. A division factor M of a divider 102 which divides the number of pulses in an input signal into 1/M pulses is selected corresponding to the frequency of the input signal. FIG. 2A shows that an input signal 201 that is to be measured is supplied at an input terminal 101 and provided to the divider 102 whose output generates the divided output 203 shown in FIG. 2C. The divided output 203 is transmitted to a gate signal generator 103 comprising, for example, a toggle-type flip-flop. The gate signal generator 103 generates the gate signal 204 shown in FIG. 2D which has the length of one period of the divided input signal 203 derived from the divider 102. The gate signal 204 thus generated is supplied to an AND gate 104 to open the AND gate 104 with its high level.

The other input terminal of the AND gate 104 is provided with a clock signal 205 having a constant period $T_0$ from a clock signal generator 105 as shown in FIG. 2E. When the gate signal 204 is at high level, the clock signal 205 is supplied via the AND gate 104 to a counter 106. FIG. 2F shows the gated clock signal 205 derived from the AND gate 104. The total number of the gated clock pulses N is counted by the counter 106.

The counted result is provided to a calculator 107 wherein the frequency F and the period P of the input signal 201 are calculated. Namely, in the case that the number of the clock signals 205 counted by the counter 106 is N, the input frequency and period are obtained by calculating, $F = M/NT_0$ and $P = NT_0/M$, respectively. The calculated frequency or period is displayed by a display 108. The operation described above starts after a reset signal 202 provided from a terminal 221 as shown in FIG. 2B.

In this conventional period and frequency measuring instrument, there arise fractional times $\Delta T_{x1}$ and $\Delta T_{x2}$ corresponding to the time differences between the rise of the gate signal 204 and the first gated clock signal and between the fall of the gate signal 204 and the immediately following clock signal as illustrated in FIG. 2F. In order to make the fractional times $\Delta T_{x1}$, $\Delta T_{x2}$ small so as to improve measurement accuracy, it is necessary to use clock signals of higher frequency. However, utilization of the higher frequency clock signals requires both the AND gate and the counter 106 to operate at high speed, which makes the instrument expensive. Although the fractional times $\Delta T_{x1}$, $\Delta T_{x2}$ represent information effecting the accuracy of the calculated period or frequency of the input signal, conventional instruments are not able to take these fractional times into account.

SUMMARY OF THE INVENTION

It is an object of the present invention to provide a measuring instrument which is capable of measuring period and frequency of an input signal with high accuracy without using high frequency clock signals.

According to this invention, the first and second fractional times $\Delta T_{x1}$, $\Delta T_{x2}$ that are caused by the differences between the rise and fall of the divided input signal and the respective clock signals, are expanded by an expansion circuit of simple construction, so that the expanded fractional times can be measured even by a relatively low frequency clock signal with high resolution. Therefore, an accurate input signal period or frequency can be obtained by using both the number of the clock pulses gated by a gate signal, which is derived from the divided input signal and synchronized with the clock signal, and as well the number of clock pulses counted during the expanded fractional times.

DETAILED DESCRIPTION OF THE PREFERRED EMBODIMENTS

Figure 1:
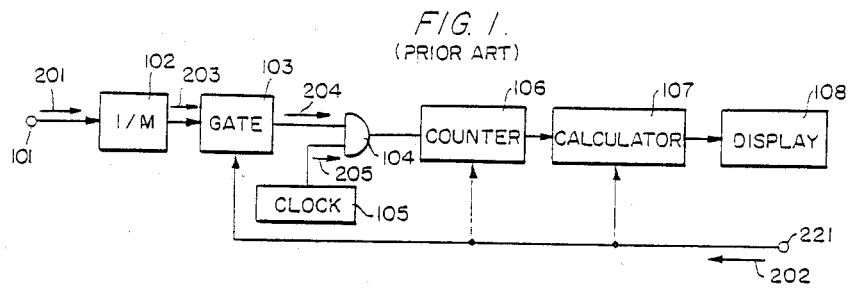
FIG. 1 shows a circuit diagram of a conventional period and frequency measuring instrument.
Figure 2:
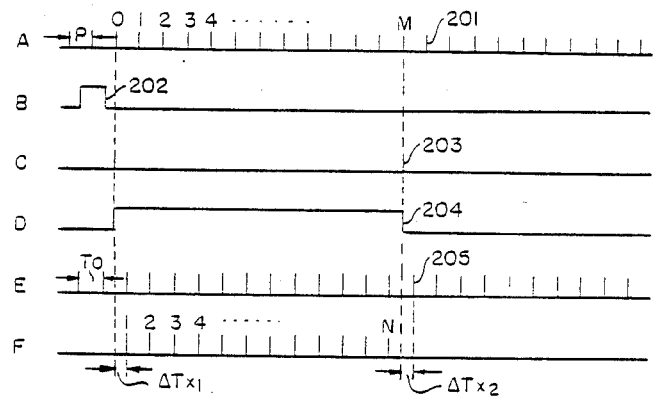
FIGS. 2A to 2F are timing charts for explaining the operation of the conventional instrument of FIG. 1.
Figure 3:
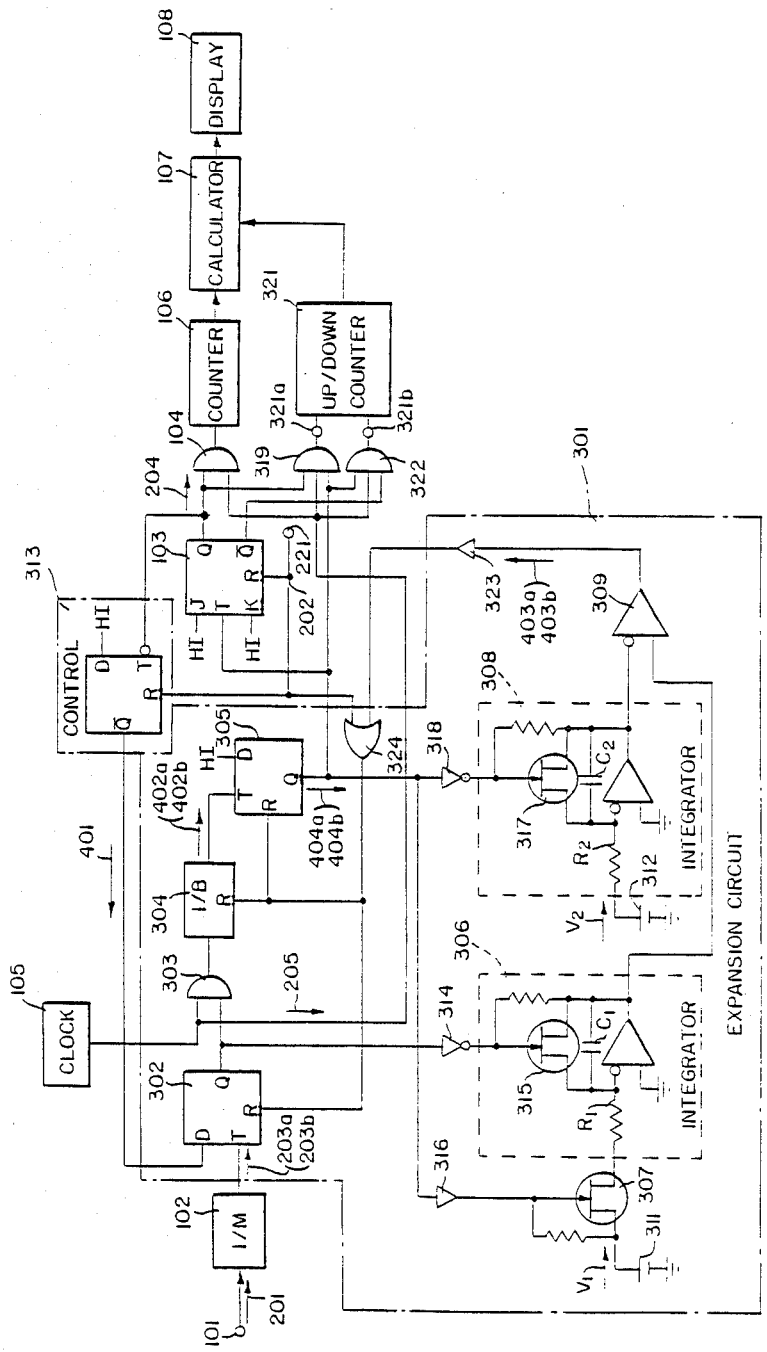
FIG. 3 is a circuit diagram showing an embodiment of a period and frequency measuring instrument of the present invention.

FIG. 3 shows one of the embodiments in accordance with the present invention and FIGS. 4A to 4N are timing charts for explaining the operation of the embodiment of FIG. 3. In FIG. 3 the components that are identical to those in FIG. 1 are denoted by the same reference characters.

An expansion circuit 301 is provided for expanding the fractional times $\Delta T_{x1}$, $\Delta T_{x2}$ by predetermined amounts. The main components comprising the expansion circuit 301 are D-type flip-flops 302 and 305, a divider 304, integrators 306 and 308, a voltage comparator 309 and a hold switch 307. The embodiment of FIG. 3 also employs a control circuit 313 for generating a start signal, an up-down counter 321 for counting the difference between the two fractional times $\Delta T_{x1}$, $\Delta T_{x2}$ and AND gates 319 and 322 for supplying the clock signals to the up-down counter 321.

The input signal 201 that is to be measured is provided from a terminal 101 to the divider 102 which divides the input signal by a division factor M. The divided input signal from the divider 102 is supplied to the T terminal of a D-type flip-flop 302 whose Q output is connected to an AND gate 303 and also to the integrator 306 through an inverter 314 to control the time for starting the integrator 306. The AND gate 303 provides the clock signal 205 from the clock signal generator 105 to the divider 304 when the Q output of the flip-flop 302 is at high level. The divider 304 divides the clock signal by a predetermined factor B and provides the divided clock signal to the D-type flip-flop 305. The integrator 306 integrates a constant voltage $V_1$ from a voltage source 311 with an integration time constant $R_1C_1$. The integrator 308 integrates a constant voltage $V_2$ from a voltage source 312 with an integration time constant $R_2C_2$. The Q output of the flip-flop 305 is connected to the integrator 308 via an inverter 318 to control the time for starting the integration. The Q output of the flip-flop 305 is also provided via a buffer 316 to the hold switch 307 to control the hold timing of the integrator 306.

Both outputs of the integrators 306 and 308 are supplied to a voltage comparator 309 whereby coincidence in the voltages of both outputs is detected. The output of the voltage comparator 309 is provided to the reset terminal of the flip-flops 302 and 305 and the divider 304 through an OR gate 324. The control circuit 313 is comprised, for example, of a D-type flip-flop with the D terminal provided with a high level signal and the T terminal connected to a Q terminal of the gate signal generator 103. The $\overline{Q}$ output of the control circuit 313 is provided to the D terminal of the flip-flop 302. The reset signal 202 from the terminal 221 is provided to the gate signal generator 103 and the control circuit 313 and through the OR gate 324 to the flip-flops 302, 305 and the divider 304.

At the beginning of the operation, by the reset signal 202 from the terminal 221, the control circuit 313 is changed to high level to yield a start signal 401 shown in FIG. 4I which is provided to the terminal of the flip-flop 302. Thus the flip-flop 302 is turned to high level by the first divided input signal 203a provided from the divider 102 so as to open the AND gate 303 and to provide the clock signal 205 from the clock signal generator 105 to the divider 304 as in FIGS. 4C and 4D. At the same time a FET switch 315 is opened by the low level signal of the inverter 314 so that the integrator 306 starts integrating the constant voltage $V_1$ supplied through the hold switch 307. The hold switch 307 is closed at this time since the flip-flop 305 is reset. Further, the integrator 308 is not in operation at this time since the FET switch 317 is closed by the high level output of the inverter 318 derived from the low level signal of the Q output of the flip-flop 305. The integrated output of the integrator 306 gradually goes down in accordance with the integrating time constant $R_1C_1$ until the hold switch 307 is opened as shown in FIG. 4L.

The divider 304 divides the clock signal 205 provided through the AND gate 303 into 3, for example, that is, the division factor B of the divider 304 is selected to be 3 in this case. Thus by the third clock pulse after the first divided input 203a the divider 304 yields the first divided clock pulse 402a at its output. By the first divided clock pulse 402a supplied from the divider 304 at time $t_1$, the state of the flip-flop 305 is changed to high level, thus making the hold switch 307 open so that the integrator 306 stops the integration and holds the integrated voltage $E_1$ as in FIG. 4L. Therefore, the time interval $T_a$ during which the integrator 306 integrates the constant voltage $V_1$ becomes $\Delta T_{x1} + 2T_0$, where $T_0$ is the period of the clock signal 205. The reason for integrating the constant voltage $V_1$ longer than the first fractional time $\Delta T_{x1}$ by $2T_0$, in this embodiment, is to obtain a sufficiently large value of the integrated voltage at the ouput of the integrator 306 without using a high speed operation amplifier in the integrator 306, in other words that the integrator 306 can be low in cost.

At time $t_1$, by the Q output of the flip-flop 305 supplied via the inverter 318, the FET switch 317 is opened so that the integrator 308 starts integrating the constant voltage $V_2$ from the voltage source 312 with an integration time constant of $R_2C_2$. The time constant $R_2C_2$ and the constant voltage $V_2$ are selected to generate an integrated output with a smaller slope than that generated by the integrator 306 for expanding the fractional times. Also at time $t_1$, by the high level signal from the flip-flop 305, the gate signal generator 103 is turned to high level as in FIG. 4F so as to open the AND gate 104. Thus the clock signal from the clock signal generator 105 is supplied to the counter 106 whereby the number of clock pulses is counted in accordance with FIG. 4G. At the same time, by the high level signals from both the flip-flop 305 and the gate signal generator 103, the AND gate 319 is opened and provides the clock signal to an up-count terminal 321a of the up-down counter 321. Therefore the up-down counter 321 up-counts the clock pulses until the AND gate 319 is closed.

When the integrated output of the integrator 308 coincides with the hold voltage $E_1$ of the integrator 306, the voltage comparator 309 generates a coincidence signal 403a at time $t_2$ as in FIG. 4N. The flip-flops 302, 305 and the divider 304 are reset by the coincidence signal 403a provided through a buffer 323 and the OR gate 324. Because of the changing state of the flip-flop 305, the AND gate 319 is closed and thus the up-down counter 321 stops up-counting the clock pulses. Thus the number of the clock pulses counted in the up-down counter 321 is $n_1$ as in FIG. 4G in this example.

The time period $T_1$ during which the AND gate 319 is open, in other words during which the number of the clock pulses is counted by the up-down counter 321, is equal to the product of $(\Delta T_{x1} + 2T_0)$ and $R_2C_2V_1/R_1C_1V_2$. In other words, the time period Ta produced by the integrator 306 corresponding to the fractional time $\Delta T_{x1}$ is expanded by the integrator 308 by an expansion factor $A = R_2C_2V_1/R_1C_1V_2$, so that even a low frequency clock signal can be used to measure the fractional time with high resolution.

Figure 4:
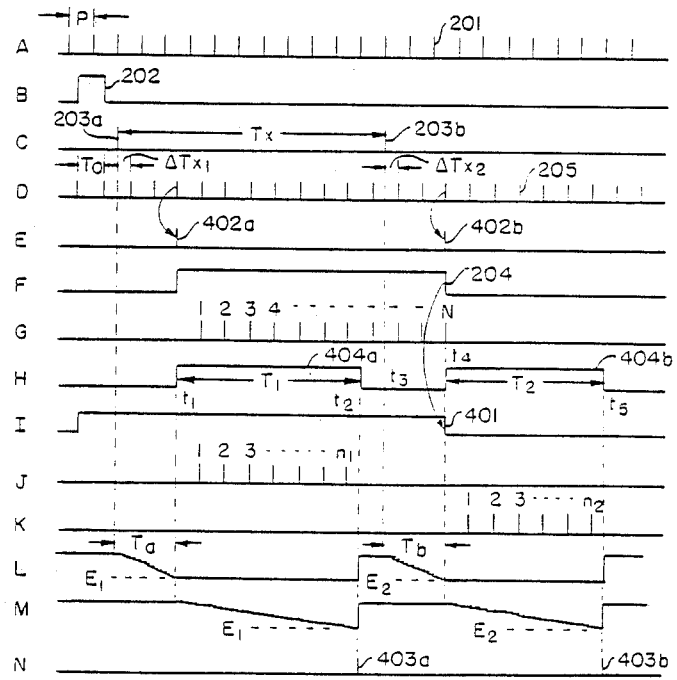
FIGS. 4A to 4N are timing charts for explaining the operation of the embodiment of FIG. 3.

For measuring the second fractional time $\Delta T_{x2}$ the embodiment of FIG. 3 works as follows. Since the flip-flops 302 and 305 are reset by the coincidence signal 403a, the integrators 306 and 308 are set to their initial conditions, that is, the hold switch 307 and the FET switches 315 and 317 are closed. Then the divider 102 provides the second divided input signal 203b at time $t_3$ as shown in FIG. 4C to the flip-flop 302. The division factor M of the divider 102 is selected according to the frequency of the input signal 201 for generating a divided signal having a longer period than the time required for measuring the expanded fractional time. In other words, the division factor M is selected to generate the second divided input signal 203b shown in FIG. 4C after the time $t_2$ as in FIG. 4. The flip-flop 302 goes to high level in response to the second divided input signal 203b, so that the AND gate 303 is opened and the integrator 306 starts integrating with the time constant $R_1C_1$.

The divider 304 again divides the clock signal 205 and generates the divided signal 402b shown in FIG. 4E in synchronism with the third clock pulse of the clock signal 205 supplied via the AND gate 303. By the divided signal 402b the output Q of the flip-flop 305 is changed to high level as in FIG. 4H so that the hold switch 307 opens and thus the integrator 306 holds the integrated output $E_2$ at time $t_4$. Therefore, the time interval Tb between $t_3$ and $t_4$ during which the integrator 306 integrates the constant voltage $V_1$ is $\Delta T_{x2} + 2T_0$. Thus the hold voltage $E_2$ is dependent on the second fractional time $\Delta T_{x2}$.

At the same time the gate signal generator 103 is turned to low by the rise of the ouput signal of the flip-flop 305 so as to close the AND gate 104. Accordingly, the counter 106 stops counting the number of clock signal 205 supplied through the AND gate 104. The counted data in the counter 106 becomes N in accordance with FIG. 4G. As has been mentioned above, the gate signal 204 that is generated by the gate signal generator 103 is synchronized with the clock signal 205. The reason for synchronizing the gate signal 204 with the clock signal 205 is to separate the period Tx shown in FIG. 4C from the fractional times since the fractional times are measured by the up-down counter 321.

At time $t_4$ the integrator 308 starts integrating the constant voltage $V_2$ with the time constant $R_2C_2$. Also at time $t_4$, the other output of the gate signal generator 103 opens the AND gate 322 whose output is connected to a down-count terminal 321b of the up-down counter 321. Thus the up-down counter 321 down-counts the number of the clock pulses, that is, subtracts the number of clock pulses from the data already counted during the time period $T_1$. The low level signal from the gate signal generator 103 is also supplied to the control circuit 313 so that the start signal 401 shown in FIG. 4I is changed and remains at low level until the next reset signal 202 is applied.

When the integrated output of the integrator 308 reaches the hold voltage $E_2$ the voltage comparator 309 generates a coincidence signal 403b shown in FIG. 4N at time $t_5$. By the coincidence signal 403b the flip-flops 302, 305 and the divider 304 are reset, and thusly the AND gates 303, 322 are closed and both the integrators 306 and 308 are set to their initial conditions. Therefore the AND gate 322 provides the clock signal to the up-down counter 321 during the time interval $T_2$ which starts at the beginning of the integration of the integrator 308 and ends at the occurrence of the coincidence signal 403b.

Similarly as in regard to the period $T_1$, the time period $T_2$ is equal to the product of $(\Delta T_{x2}+2T_0)$ and $R_2C_2V_1/R_1C_1V_2$. That is, the number of clock pulses $n_2$ applied to the up-down counter 321 during the period $T_2$ is dependent on to the expanded value of the second fractional time $\Delta T_{x2}$.

As has been mentioned above, since the clock signal is up-counted during the period $T_1$ and down-counted during the period $T_2$, the counted data $n_1-n_2$ which is obtained by the up-down counter 321 corresponds to the difference between the first and the second fractional times $\Delta T_{x1}-\Delta T_{x2}$.

In regard to the first fractional time $\Delta T_{x1}$, the following expression is obtained:

$$n_1 T_0 = A[\Delta T_{x1} + (B-1)T_0]) \quad (1)$$

wherein $A = R_2C_2V_1/R_1C_1V_2$, $n_1$ is the number of pulses up-counted by the up-down counter 321, $T_0$ is the time period of the clock signal 205, B is the division factor of the divider 304 and A is the expansion factor of the expansion circuit 313.

Similarly, as to the second fractional time $\Delta T_{x2}$ the following expression is obtained:

$$n_2 T_0 = A[\Delta T_{x2} + (B-1)T_0] \quad (2)$$

wherein $n_2$ represents the number of clock pulses down-counted by the up-down counter 321.

The time interval $T_x$ between the divided input signals 203a and 203b is obtained by the following expression:

$$T_x = NT_0 + (\Delta T_{x1} - \Delta T_{x2}) \quad (3)$$

wherein N is the number of clock pulses counted by the counter 106. Therefore, by using equations (1) and (2), equation (3) becomes, $$\begin{aligned} T_x &= NT_0 + [\Delta T_{x1} + (B-1)T_0] - [\Delta T_{x2} + (B-1)T_0] \\ &= NT_0 + n_1T_0/A - n_2T_0/A \\ &= T_0[N + (n_1 - n_2)/A] \\ &= T_0[N + (V_2R_1C_1/V_1R_2C_2)(n_1 - n_2)] \end{aligned} \quad (4)$$

Since the values of $T_0$ and $V_2R_1C_1/V_1R_2C_2$ are already known, and since the counted data N and $(n_1-n_2)$ are provided, from the counter 106 and the up-down counter 321, respectively, the time period $T_x$ can be calculated by the calculator 107.

Assuming that the division factor of the divider 102 is represented by M, the time period of the input signal 201 to be measured is calculated as follows:

$$\begin{aligned} P &= T_x/M \\ &= (T_0/M)[N + (V_2R_1C_1/V_1R_2C_2)(n_1 - n_2)] \end{aligned} \quad (5)$$

Also, the frequency F of the input signal 201 is $$\begin{aligned} F &= 1/P \\ &= \frac{M}{T_0[N + (V_2R_1C_1/V_1R_2C_2)(n_1 - n_2)]} \end{aligned} \quad (6)$$

The period P or frequency F of the input signal 201 thusly obtained is displayed by the display 108.

In the above description, the same clock signal is supplied to both the counter 106 and the up-down counter 321, but it is possible to use different clock signals. In the case that the time period of the clock signal that is provided to the counter 106 is $T_{01}$, and the time period of the clock signal provided to the up-down counter 321 is $T_{02}$, the period P and the frequency F of the input signal to be measured are obtained by the following expressions:

$$P = (T_{01}/M)[N + (T_{02}V_2R_1C_1/T_{01}V_1R_2C_2)(n_1 - n_2)] \quad (7)$$

$$F = \frac{M}{T_{01}[N + (T_{02}V_2R_1C_1/T_{01}V_1R_2C_2)(n_1 - n_2)]} \quad (8)$$

What is claimed is:

1. An instrument for determining the period and frequency of an input signal, comprising
 clock means for providing first and second clock signals,
 first divider means for dividing said input signal by a predetermined division factor to output a divided signal having a minimum period, wherein a first fractional time is defined between a first output of said first divider means and the first clock pulse of said first clock signal thereafter, and a second fractional time is defined between the following output of said first divider means and the first clock pulse of said first clock means thereafter,
 gate signal generating means for generating a gate signal synchronized with said first clock signal,
 counter means for counting the clock pulses of said first clock signal during said gate signal, expansion means for expanding each said fractional time, at least the expanded first fractional time being shorter than the minimum period of said divided signal, up-down counter means for providing a count of the clock pulses of said second clock signal corresponding to the difference between the first and second expanded fractional times, and calculator means for calculating the period and frequency of said input signal by adding the count from said counter means to a value corresponding to the count from the up-down counter means.

2. The instrument of claim 1, comprising said expansion means including a first integrator for integrating a first voltage level with a first time constant during a period of time equal to each said fractional time plus a predetermined integral number of clock pulses of the first clock signal, and a second integrator for integrating a second voltage level with a second time constant for each respective expanded fractional time to obtain an integrated value that is the same as each respective final integrated value of the first voltage level, wherein the first and second voltage levels and time constants are selected to provide, for each said fractional time, a smaller slope in time for the absolute value of the integrated value of the second voltage level than for the slope of the absolute value of the integrated value of the first voltage level.

3. The instrument of claim 1, said up-down means counter up-counting the clock pulses of said second clock signal during the expanded first fractional time and down-counting the clock pulses of said second clock signal during the expanded second fractional time.

4. The instrument of claim 2, comprising said first and second clock signals having periods $T_{01}$ and $T_{02}$, respectively, said first and second voltage levels being $V_1$ and $V_2$, respectively, said first and second time constants being $R_1C_1$ and $R_2C_2$ corresponding to respective resistance and capacitive elements of said first and second integrators, respectively, said division factor of said divider means being $1/M$, wherein M is an integer larger than one, said counter means counting N of said clock pulses of said first clock signal during said gate signal, and said up-down counter means up-counting $n_1$ of said second clock pulses during the expanded first fractional time and down-counting $n_2$ of said second clock pulses during the expanded second fractional time, wherein the period P and frequency F of said input signal are calculated by said calculator means as:

$$P=(T_{01}/M)[N+(T_{02}V_2R_1C_1/T_{01}V_1R_2C_2)(n_1-n_2)]$$

and its inverse, respectively.

5. The instrument of claim 4, said second clock signal being the same as said first clock signal.

6. The instrument of claim 1, 2, 3, 4 or 5 said minimum period of the output of the first divider means being equal to or longer than each respective sum of any one of said fractional times, plus said predetermined number of clock pulses of the first clock signal, plus the respective expanded fractional time.

* * * * *